United States Patent
Clerc

(10) Patent No.: US 10,451,670 B2
(45) Date of Patent: Oct. 22, 2019

(54) METHOD AND DEVICE FOR MONITORING A CRITICAL PATH OF AN INTEGRATED CIRCUIT

(71) Applicant: STMicroelectronics (Crolles 2) SAS, Crolles (FR)

(72) Inventor: Sylvain Clerc, Grenoble (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 280 days.

(21) Appl. No.: 15/378,663

(22) Filed: Dec. 14, 2016

(65) Prior Publication Data

US 2017/0299651 A1    Oct. 19, 2017

(30) Foreign Application Priority Data

Apr. 18, 2016  (FR) ...................................... 16 53409

(51) Int. Cl.
| | |
|---|---|
| *G01R 31/28* | (2006.01) |
| *G01R 31/30* | (2006.01) |
| *G01R 31/317* | (2006.01) |
| *H03K 5/133* | (2014.01) |
| *H03K 19/003* | (2006.01) |

(52) U.S. Cl.
CPC ..... *G01R 31/2882* (2013.01); *G01R 31/3016* (2013.01); *G01R 31/31725* (2013.01); *H03K 5/133* (2013.01); *H03K 19/00369* (2013.01)

(58) Field of Classification Search
CPC ....... H01L 21/00; H01L 2221/00; G06F 1/00; G01R 1/00

See application file for complete search history.

(56) References Cited

U.S. PATENT DOCUMENTS

| | | | |
|---|---|---|---|
| 2009/0044054 A1* | 2/2009 | Bueti | G06F 11/1608 714/26 |
| 2013/0241690 A1 | 9/2013 | Wallace et al. | |
| 2013/0311799 A1* | 11/2013 | Fitzpatrick | G06F 1/3296 713/320 |

(Continued)

FOREIGN PATENT DOCUMENTS

| | | |
|---|---|---|
| FR | 3010795 A1 | 3/2015 |
| WO | WO-2015161890 A1 | 10/2015 |

OTHER PUBLICATIONS

INPI Search Report and Written Opinion for FR 1653409 dated Jan. 20, 2017 (7 pages).

(Continued)

*Primary Examiner* — Jermele M Hollington
*Assistant Examiner* — Temilade S Rhodes-Vivour
(74) *Attorney, Agent, or Firm* — Crowe & Dunlevy

(57) ABSTRACT

A device for monitoring a critical path of an integrated circuit includes a replica of the critical path formed by sequential elements mutually separated by delay circuits that are programmable though a corresponding main multiplexer. A control circuit controls delay selections made by each main multiplexer. A sequencing module operates to sequence each sequential element using a main clock signal by delivering, in response to a main clock signal, respectively to the sequential elements, secondary clock signals that are mutually time shifted in such a manner as to take into account the propagation time inherent to the main multiplexer.

35 Claims, 6 Drawing Sheets

(56) References Cited

U.S. PATENT DOCUMENTS

| | | | |
|---|---|---|---|
| 2014/0028364 A1* | 1/2014 | Venkatraman | G06F 1/206 |
| | | | 327/262 |
| 2014/0089885 A1* | 3/2014 | Le Coz | G06F 17/5077 |
| | | | 716/128 |
| 2014/0136177 A1 | 5/2014 | Lee et al. | |
| 2014/0236319 A1* | 8/2014 | Richetta | G05B 19/048 |
| | | | 700/80 |
| 2015/0185268 A1* | 7/2015 | Falk | G06F 21/71 |
| | | | 726/23 |
| 2016/0013792 A1* | 1/2016 | Ashouei | G11C 29/021 |
| | | | 327/543 |

OTHER PUBLICATIONS

Clerc, et al: "A 0.33V/-40oC Process/Temperature Closed-Loop Compensation SoC Embedding All-Digital Clock Multiplier and DC-DC Converter Exploiting FDSOI 28nm Back-Gate Biasing," 2015 IEEE International Solid-State Circuits Conference, pp. 150-152.

Clerc, et al: "A 0.33V/-40oC Process/Temperature Closed Loop Compensation SoC Embedding All-Digital Clock Multiplier and DC-DC Converter Exploiting FDSOI 28nm Back-Gate Biasing," ISSCC Session 8, Low-Power Digital Techniques, 2015 (38 pages).

Tschanz, et al: "Tunable Replica Circuits and Adaptive Voltage-Frequency Techniques for Dynamic Voltage, Temperature, and Aging Variation Tolerance," 2009 Symposium on VLSI Circuits Digest of Technical Papers, pp. 112-113.

* cited by examiner

FIG.3

| MREF | DIS (ES2, ES3) | Result |
|---|---|---|
| BOOL | BOOL, BOOL | Too Fast |
| BOOL | BOOL, $\overline{\text{BOOL}}$ | Adjusted |
| BOOL | $\overline{\text{BOOL}}$, $\overline{\text{BOOL}}$ | Too Slow |

FIG.6

| Group 1 | BOOL | BOOL | BOOL | BOOL | BOOL | BOOL | BOOL | BOOL | BOOL |
|---|---|---|---|---|---|---|---|---|---|
| Group 2 | BOOL | BOOL | BOOL | BOOL | BOOL | BOOL | BOOL | BOOL | BOOL |
| Group 3 | BOOL | BOOL | BOOL | BOOL | BOOL | BOOL | BOOL | BOOL | BOOL |

METHOD AND DEVICE FOR MONITORING A CRITICAL PATH OF AN INTEGRATED CIRCUIT

PRIORITY CLAIM

This application claims the priority benefit of French Application for Patent No. 1653409, filed on Apr. 18, 2016, the disclosure of which is hereby incorporated by reference in its entirety.

TECHNICAL FIELD

Various embodiments and their implementation relate to digital integrated circuits and, more particularly, digital integrated circuits comprising at least one monitoring device for monitoring propagation times of at least one critical path.

BACKGROUND

Conventionally, a target time margin for transmission of signals is identified for a given critical path within a digital integrated circuit in order to ensure correct implementations of the integrated circuit and notably of the critical path.

Generally speaking, such a monitoring device comprises one or more delay stages configured for generating an initial transmission delay (or propagation time) as a function of the target time margin. This initial delay is, for example, equal to one clock cycle of the digital integrated circuit minus the target time margin.

In order to best monitor the real time margin on the critical path, the monitoring device is therefore disposed directly on or close to the critical path.

Subsequent notably to the aging of the digital integrated circuit, the real time margin, determined by the monitoring device, tends to degrade.

Consequently, the monitoring device is also configured for warning of a partial or total violation of the target time margin, which allows the integrated circuit to carry out compensations by anticipation so as to avoid failures of the integrated circuit.

For this purpose, an adjustment of the clock frequency or of power supply voltage of the transistors within the digital integrated circuit is generally carried out.

Currently, such a monitoring device may be implemented in such a manner as to generate a fixed or programmable initial delay by using programming multiplexers.

However, the presence of these programmable multiplexers can falsify the detection of the propagation time in the monitoring device and, as a consequence, the monitoring of the critical path.

SUMMARY

Thus, according to one embodiment and its implementation, a technical solution of low complexity is provided for monitoring a critical path of an integrated circuit allowing a total or partial cancelling of a propagation time inherent to programmable elements of the monitoring device.

According to one aspect, a device is provided for monitoring a critical path of an integrated circuit, comprising a replica of the critical path comprising at least two sequential elements separated from one another by programmable delay means by means of at least one main multiplexer, control means configured for controlling the at least one main multiplexer, and a sequencing module configured for sequencing each sequential element based on a main clock signal.

According to a general feature of this aspect, the sequencing module is configured for delivering, starting from the main clock signal, respectively to the at least two sequential elements, two secondary clock signals with a mutual time delay so as to take into account at least one propagation time inherent to the at least one main multiplexer.

According to one variant embodiment, the replica of the critical path may comprise a chain of N sequential elements, with N greater than 2, and the delay means may comprise N−1 delay stages, each delay stage being programmable by means of at least one main multiplexer, two successive sequential elements being separated by a delay stage, and the sequencing module may be configured for delivering, starting from the main clock signal, respectively to the N sequential elements, N secondary clock signals, two successive secondary clock signals being mutually time shifted in such a manner as to take into account at least one propagation time inherent to the at least one main multiplexer of the corresponding delay stage.

According to another variant, the delay means comprise several main multiplexers and the sequencing module is configured for delivering, starting from the main clock signal, respectively to the sequential elements, secondary clock signals mutually time shifted in such a manner as to take into account the propagation times inherent to all the main multiplexers.

According to one embodiment compatible with this other variant, the sequencing module may comprise as many secondary multiplexers as main multiplexers, the secondary multiplexers being organized into a chain of N−1 groups of secondary multiplexers connected in series, each group being associated with the main multiplexer(s) of the corresponding delay stage, each secondary multiplexer being matched with the corresponding main multiplexer, the inputs of the first secondary multiplexer of the first group being intended to receive the main clock signal, the first sequential element being intended to be sequenced by the main clock signal and the N−1 following sequential elements being intended to be sequenced by the N−1 secondary clock signals respectively delivered by the outputs of the last multiplexers of the N−1 groups, and the control means are furthermore configured for controlling in an identical manner the secondary multiplexers and the main multiplexers, each secondary multiplexer being matched with a corresponding main multiplexer.

According to yet another variant, the delay means comprise several main multiplexers and the sequencing module is configured for delivering, starting from the main clock signal, respectively to the sequential elements, secondary clock signals synchronized or mutually time shifted in such a manner as to selectively take into account the propagation times inherent to all the main multiplexers or to only at least one of the main multiplexers.

According to one embodiment compatible with the latter variant, the sequencing module may comprise as many secondary multiplexers as main multiplexers, the secondary multiplexers being organized into a chain of N secondary multiplexers connected in series, each secondary multiplexer being matched with the corresponding main multiplexer, and at least two mutually-matched sequencing multiplexers, the inputs of the first secondary multiplexer being designed to receive the main clock signal, the output of the first sequencing multiplexer being designed to deliver the first secondary clock signal to the first sequential element, the inputs of the following sequencing multiplexer(s) being designed to receive at least the main clock signal and the output signal(s) of the secondary multiplexer(s) associated with the main multiplexer(s) of at least one delay stage, and the output of the next sequencing multiplexer(s) being designed to deliver to at least one sequential element coupled to the output of the at least one delay stage the secondary clock signal(s), and the control means are furthermore configured for controlling in an identical manner the secondary multiplexers and the main multiplexers and for controlling the sequencing multiplexers by a selection signal.

According to another embodiment compatible with the latter variant, the sequencing module may for example comprise as many sequencing multiplexers as sequential elements, the inputs of the first sequencing multiplexer being designed to receive the main clock signal and the output of the first sequencing multiplexer being designed to deliver the first secondary clock signal to the first sequential element, the inputs of the following sequencing multiplexers being designed to receive the main clock signal and the output signal(s) from the corresponding secondary multiplexer and, where relevant, from the preceding secondary multiplexer(s), each sequencing multiplexer being configured for delivering the corresponding secondary clock signal to the corresponding sequential element.

By way of example, each delay stage may comprise a main multiplexer, and several delay elements coupled to the main multiplexer.

In such a delay stage, the delay elements may advantageously be different in such a manner as to allow a rough adjustment and a fine adjustment of the delay in each delay stage to be carried out.

Furthermore, the device may for example be fabricated in an integrated manner in and on a substrate of the silicon-on-insulator type.

By way of example, the substrate may be a substrate of the fully-depleted silicon-on-insulator type, known by those skilled in the art under the acronym FDSOI. The technology may for example be a 28 nm technology. The FDSOI technology advantageously allows compensations to be applied by modifying the substrate biasing of transistors of the integrated circuit in a positive/negative manner, commonly denoted by those skilled in the art using the acronym FBB/RBB (Forward Body Bias/Reverse Body Bias).

It should be noted that compensations via FBB/RBB are generally easier to apply than conventional adjustments of the power supply voltage of transistors.

According to another aspect, a method is provided for sequencing a device for monitoring a critical path of an integrated circuit, comprising a replica of the critical path comprising at least two sequential elements mutually separated by delay means programmable by means of at least one main multiplexer.

According to one general feature of this other aspect, it comprises the delivery to the at least two sequential elements, starting from a main clock signal, of two secondary clock signals mutually time shifted in such a manner as to take into account at least one propagation time inherent to the at least one main multiplexer.

The replica of the critical path may comprise a chain of N sequential elements, with N greater than 2. The delay means may comprise N−1 delay stages. Each delay stage may be programmable by means of at least one main multiplexer. Two successive sequential elements may be separated by a delay stage. The method may comprise the delivery respectively to the N sequential elements, starting from the main clock signal, of N secondary clock signals. Two successive secondary clock signals may be mutually time delayed in such a manner as to take into account at least one propagation time inherent to the at least one main multiplexer of the corresponding delay stage.

According to one embodiment, the delay means comprise several main multiplexers and the method comprises the delivery, starting from the main clock signal, respectively to the sequential elements, of secondary clock signals mutually time shifted in such a manner as to take into account the propagation times inherent to all the main multiplexers.

According to another embodiment, the delay means comprise several main multiplexers and the method comprises the delivery, starting from the main clock signal, respectively to the sequential elements, of secondary clock signals mutually time shifted in such a manner as to selectively take into account the propagation times inherent to all the main multiplexers or to only at least one of the main multiplexers.

BRIEF DESCRIPTION OF THE DRAWINGS

Other advantages and features of the invention will become apparent upon examination of the detailed description of non-limiting embodiments, and from the appended drawings in which:

FIG. 3 illustrates performance of an absolute comparison of delay;

FIG. 6 shows results.

DETAILED DESCRIPTION

Figure 1:
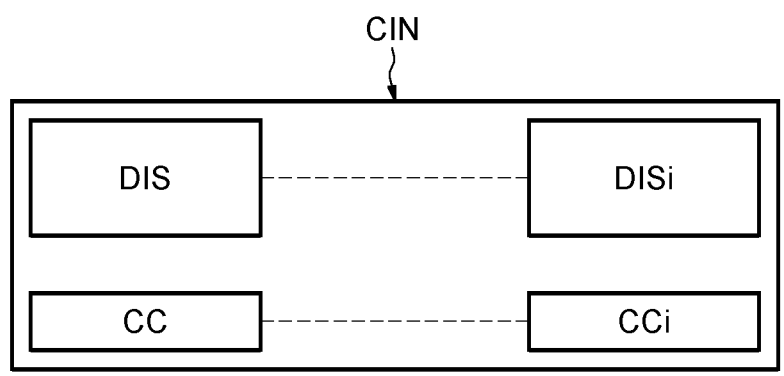
FIG. 1 illustrates schematically a digital integrated circuit including a critical path.

FIG. 1 illustrates schematically one example of a digital integrated circuit CIN. The integrated circuit CIN here comprises, for example, a critical path CC identified during the design of the integrated circuit CIN, and a monitoring device DIS associated with this critical path CC.

As the critical path CC generally generates a maximum delay (or propagation time) within the integrated circuit CIN, this maximum delay is considered as being critical for defining a maximum frequency of operation of the integrated circuit CIN.

In order to best carry out a monitoring of a critical path CC and to have the minimum influence on the critical path CC, a target time margin for the critical path CC is identified and the device DIS comprises a replica of the critical path RCC disposed on or near to the critical path CC.

It should be noted that it is also possible to have several critical paths CCi within the same digital integrated circuit and to have as many monitoring devices DISi dedicated to monitoring the critical paths.

Figure 2:
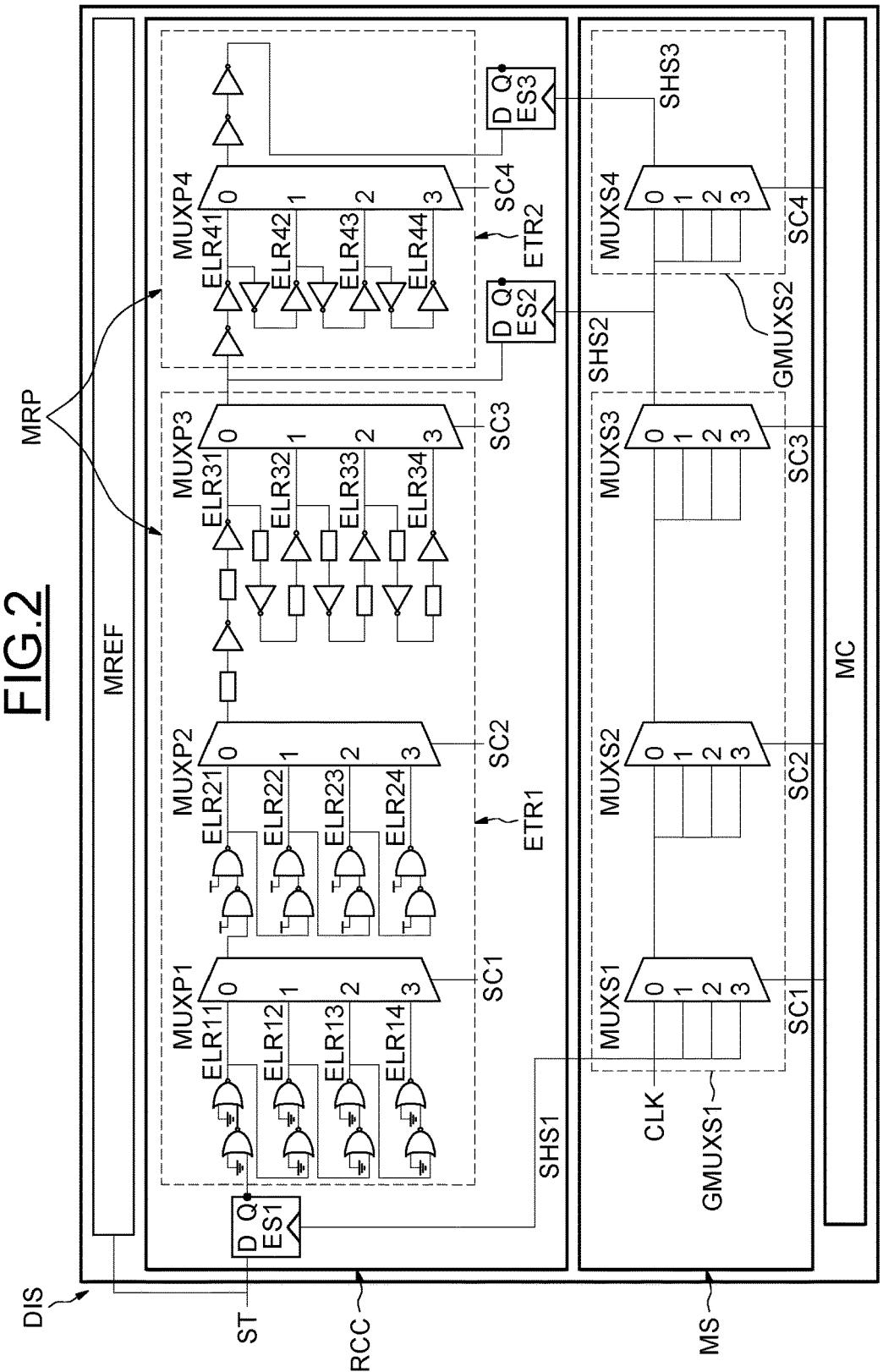
FIG. 2 illustrates one example of a monitoring device.

Reference is now made to FIG. 2 in order to illustrate one example of the monitoring device DIS.

The device DIS comprises: a replica RCC of the critical path here comprising, for example, a first, a second and a third sequential element ES1, ES2, ES3; a programmable delay circuit MRP containing a first delay stage ETR1 having three main multiplexers MUXP1 to MUXP3 coupled between the first and second sequential elements ES1 and ES2 and a second delay stage ETR2 having a fourth main multiplexer MUXP4 coupled between the second and third sequential elements ES2 and ES3; a reference circuit MREF configured for delivering a reference signal SR for the replica of the critical path RCC which is considered as always being correct; a sequencing module MS configured for sequencing the sequential elements ES1 to ES3 using a main clock signal CLK; and a control circuit MC configured for controlling the main multiplexers MUXP1 to MUXP4 of the replica RCC of the critical path.

Each sequential element ES1 to ES3 here comprises, for example, a flip-flop of the D type.

It should be noted that here a delay generated between the first and the second sequential element ES1 and ES2 corresponds to the delay to be monitored on the corresponding critical path CC.

Furthermore, the third element ES3 and the second delay stage ETR2 are configured, for example, for verifying that the speed of the critical path CC is not too high.

As illustrated in FIG. 2, the inputs of each main multiplexer MUXPj are respectively coupled to four corresponding delay elements ELRj1 to ELRj4 and its output is coupled to the first delay element ELR(j+1)1 itself coupled to the following main multiplexer MUXPj+1.

In the example illustrated in FIG. 2, the delay elements ELRj1 to ELRj4 coupled to the same main multiplexer MUXPj are identical, but they are different from those coupled to another main multiplexer MUXPk. The first delay stage ETR1 comprises four delay elements ELR11 to ELR14 of the NOR gate type, four delay elements ELR21 to ELR24 of the NAND gate type, and four delay elements ELR31 to ELR34 of the interconnection line type. The second delay stage ETR2 comprises four delay elements ELR41 to ELR44 of the inverter type.

The delay elements ELR11 to ELR34 of the first delay stage ETR1 are here configured for carrying out a rough delay adjustment whereas those ELR41 to ELR44 of the second delay stage ETR2 are configured for carrying out a fine delay adjustment.

It should be noted that, as a variant, it is also possible to have identical delay elements coupled to each main multiplexer, as is described later on in the present description.

The device DIS furthermore comprises the control circuit MC configured for delivering control signals SC1 to SC4, respectively, to the main multiplexers of the delay stages ETR1 and ETR2 in such a manner as to program the delays of the delay stages ETR1 and ETR2 taking into account the structure of the critical path CC.

The first delay stage ETR1 is consequently configurable via the first three control signals SC1 to SC3 in such a manner as to generate a first initial delay RI1 comprising a first programmed delay coming from the delay elements ELR11 to ELR34 of the first delay stage ETR1 and a first intrinsic delay equal to the sum of the propagation times RINT1 to RINT3 inherent to the first three main multiplexers MUXP1 to MUXP3.

The value of the first programmed delay is a function of the targeted time margin for the critical path CC. This value is, for example, equal to one clock cycle of the main clock signal CLK of the digital integrated circuit CIN reduced by the targeted time margin.

The second delay stage ETR2 is configurable via the fourth control signal SC4 in such a manner as to generate, for example, a second initial delay RI2 comprising a second programmed delay equal to the targeted time margin and a second intrinsic delay corresponding to the propagation times RINT4 inherent to the fourth main multiplexer MUXP4.

The sequencing module MS receives at the input the main clock signal CLK from the digital integrated circuit CIN and comprises as many secondary multiplexers MUXS1 to MUXS4 as main multiplexers MUXP1 to MUXP4 in the first and second delay stages ETR1 and ETR2.

By way of example, the secondary multiplexers MUXS1 to MUXSN are here organized into a chain of two groups of secondary multiplexers GMUXS1 and GMUXS2 connected in series. Each group GMUXS1 or GMUXS2 is associated with the main multiplexer(s) of the corresponding delay stage ETR1 or ETR2. Each secondary multiplexer MUXSn is matched with the corresponding main multiplexer MUXPn.

The main clock signal CLK is coupled to all the inputs of the first secondary multiplexer MUXS1 of the first group GMUXS1. The first sequential element ES1 is designed to be sequenced by the main clock signal CLK as a first secondary clock signal SHS1. The output signals of the first three secondary multiplexers MUXS1 to MUXS3 are respectively coupled to the inputs of the following secondary multiplexers in the chain MUXS2 to MUXS4.

The last secondary multiplexers MUXS3 and MUXS4 of the groups GMUXS1 and GMUXS2 respectively generate a second secondary clock signal SHS2 at their output designed to sequence the second sequential element ES2, and a third secondary clock signal SHS3 designed to sequence the third sequential element ES3.

Furthermore, the control circuit MC is additionally configured for controlling the secondary multiplexers MUXS1 to MUXSN and the main multiplexers MUXP1 to MUXPN in an identical manner.

As the secondary multiplexers MUXS1 to MUXS4 are controlled by the same control signals SC1 to SC4 of the control circuit MC as the main multiplexers MUXP1 to MUXP4, a first time shift DT1 is therefore obtained between the first secondary clock signal SHS1 and the second secondary clock signal SHS2 equal to the first intrinsic delay, and a second time shift DT2 between the second secondary clock signal SHS2 and the third secondary clock signal SHS3 equal to the intrinsic second delay.

For this reason, the first and second intrinsic delays may be respectively cancelled in the first and second initial delay RI1 and RI2 so as to generate in a more precise manner the first and second initial delay RI1 and RI2 respectively equal to the first and the second delay programmed by the two delay stages ETR1 to ETR2.

It is therefore possible not only to avoid disparities in the device DIS and the critical path CC to be monitored due to the inherent propagation times RINT1 to RINT4 of the programmable multiplexers, but also to increase the precision of monitoring of the device DIS.

In order to determine whether the first and second delays are well adjusted, a test signal ST coming from the digital integrated circuit CIN is intended to be delivered to the first sequential element ES1 and to the reference circuit MREF.

If the test signal ST has a first Boolean value VB1, the first Boolean value BOOL is for example always received at the output of the reference means MREF.

Depending on the results obtained at the outputs of the second and third sequential elements ES2 and ES3, an absolute comparison of delay of the device DIS may be carried out, as illustrated in FIG. 3.

If the device DIS is well adjusted, in other words the initial delays RI1 and RI2 are configured according to the targeted time margin MTV, the first Boolean value BOOL is obtained at the output of the second sequential element ES2 and, at the output of the third sequential element ES3, a second Boolean value $\overline{BOOL}$ is obtained opposite to the first Boolean value BOOL.

If the first Boolean value BOOL is obtained at the outputs of the second and third sequential elements ES2 and ES3, it can be determined that the operation of the digital integrated circuit CIN is too fast.

If the second Boolean value $\overline{BOOL}$ is obtained at the outputs of the second and third sequential elements ES2 and ES3, it can be determined that the operation of the digital integrated circuit CIN is too slow.

The digital integrated circuit CIN may advantageously be fabricated using a technology of the fully-depleted silicon-on-insulator type, known by those skilled in the art under the acronym FDSOI.

Also, if the operation of the circuit CIN is considered as too fast, the substrate bias voltage of the transistors of the digital integrated circuit CIN can, for example, be reduced. If this voltage is reduced until it is negative, this bias is commonly denoted by those skilled in the art using the acronym RBB (for Reverse Body Bias).

If the circuit CIN is considered as operating too slowly, the substrate bias voltage of the transistors can therefore, for example, be increased so as to increase the speed of the transistors of the circuit CIN. If this voltage is increased until it is positive for NMOS transistors and lower than the usual value of bias of the substrate (or body) for PMOS transistors, this bias is commonly denoted by those skilled in the art using the acronym FBB (for Forward Body Bias)

Figure 4:
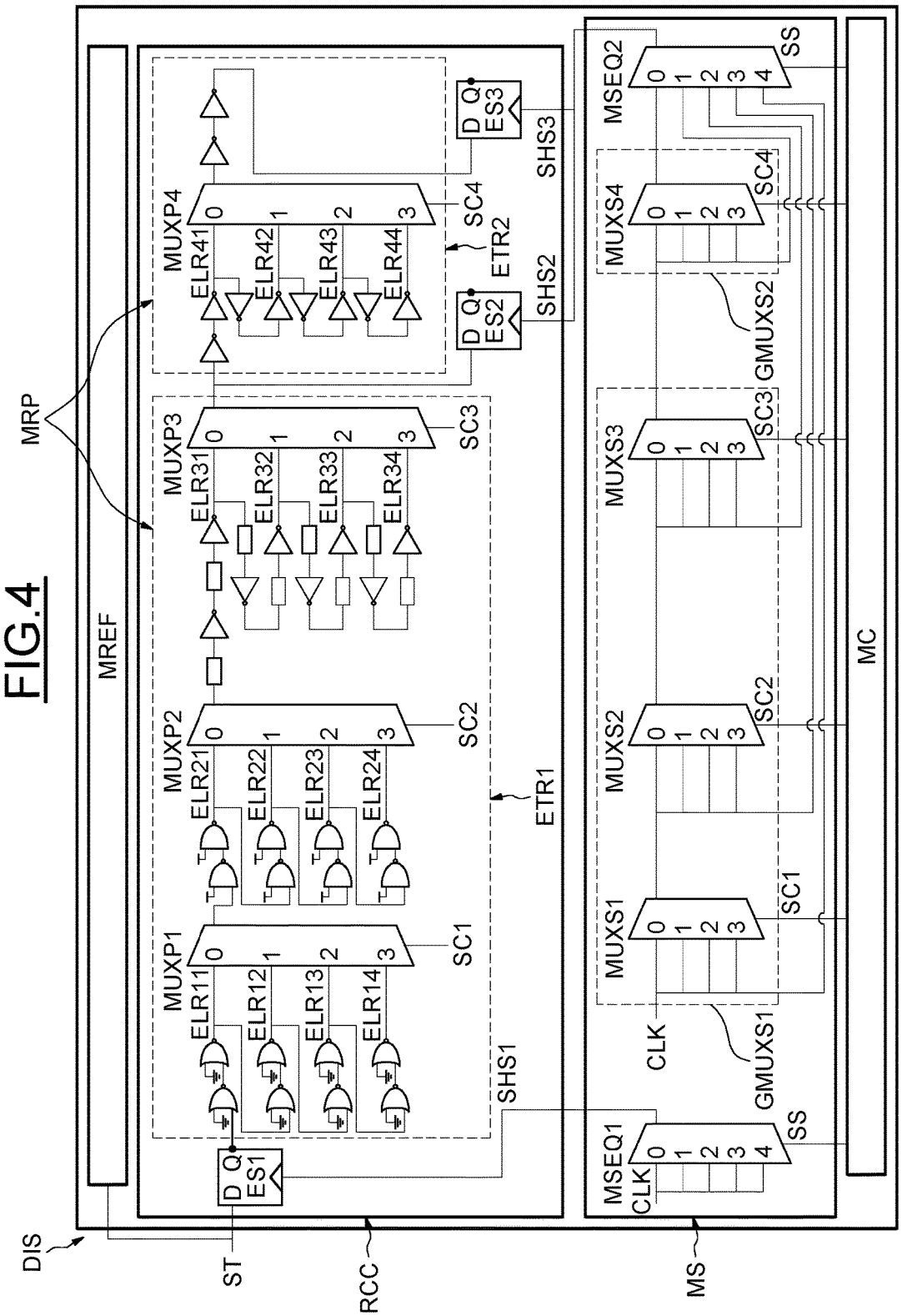
FIGS. 4-5 illustrate schematically possible variants of the monitoring device.

FIG. 4 illustrates schematically one possible variant of the monitoring device DIS, notably allowing a selective cancelling of the delays RINTi inherent to the multiplexers to be applied.

With respect to the device DIS illustrated in FIG. 2, the sequencing circuit MS furthermore comprises a first sequencing multiplexer MSEQ1 whose inputs are coupled to the main clock signal CLK and whose output is designed to deliver the first secondary clock signal SHS1 to the first sequential element ES1, and a second sequencing multiplexer MSEQ2 whose inputs are respectively coupled to the main clock signal CLK and to the outputs of the secondary multiplexers MUXS1 to MUXS4.

The first sequencing multiplexer MSEQ1 and the second sequencing multiplexer MSEQ2 are mutually matched and controlled by the same selection signal SS coming from the control circuit MC in such a manner as to generate the second and third secondary clock signals SHS2 and SHS3 for the second and third sequential elements ES2 and ES3.

Here, the second and third secondary clock signals SHS2 and SHS3 are identical and can have a value between zero and the sum of the intrinsic delays RINTi with respect to the main clock signal CLK.

In other words, the intrinsic delays RINTi of the secondary multiplexers MUXSi (and consequently the intrinsic delays RINTi of the main multiplexers) can be selectively cancelled by modifying the selection signal SS.

By way of example, if the selection signal SS is equal to 0, the intrinsic delays RINTi are totally cancelled because the signal SHS2 is shifted with respect to the signal SHS1 by 4 intrinsic delays.

If the selection signal SS is equal to 4, no intrinsic delay is cancelled because all three sequential elements ES1 to ES3 are sequenced by the signals SHS1 and SHS2 which are in phase (in other words there is no time shift between them).

Such a variant of the device DIS therefore advantageously allows selective cancelling of the intrinsic delays RINTi to be carried out corresponding to the propagation times inherent to the main multiplexers MUXPi.

According to another variant of the device DIS, the delay elements ELRjk within the same delay stage ETRj are different.

Figure 5:
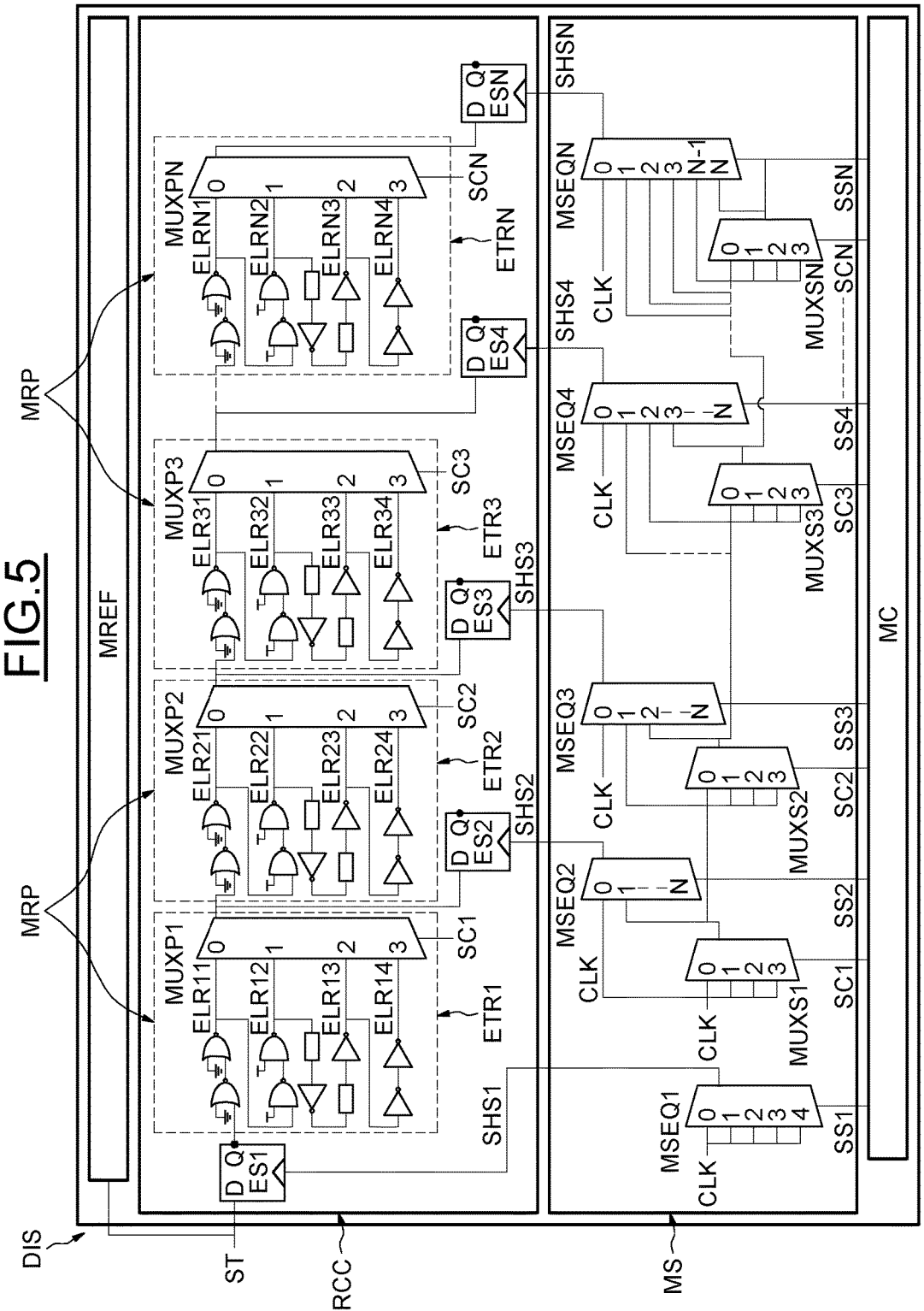

Reference is now made to FIG. 5 in order to illustrate such a variant of the device DIS.

In this variant, the device DIS has a replica of the critical path RCC comprising a first number N of sequential elements ES1 to ESN, programmable delay circuit MRP containing the first number N of delay stages ETR1 to ETRN. Each stage comprises a main delay multiplexer MUXPn and a second number M, here, for example, 4, of different delay elements ELRn1 to ELRn4, here, for example, a delay element of the NOR gate type ELRn1, a delay element of the NAND gate type ELRn2, a delay element of the interconnection line type ELRn3, and a delay element of the inverter line type ELRn4.

The delay elements ELRn1 to ELRn4 of each delay stage ETRn are coupled in series and the outputs of the delay elements ELRn1 to ELRn4 of each delay stage ETRn are respectively coupled to the inputs of the main multiplexer MUXPn of the same delay stage ETRn.

The output of each main multiplexer MUXPn is coupled to the data input D of the corresponding sequential element ESn and to the input of the first delay element ELR(n+1)1 of the following delay stage ETR(n+1).

The device DIS furthermore contains a sequencing module MS comprising N−1 secondary multiplexers MUXS1 to MUXSN−1 matched with the corresponding main multiplexers MUXP1 to MUXPN−1 and coupled in series, the inputs of the first secondary multiplexer MUXS1 being coupled to the main clock signal CLK and the output of each secondary multiplexer MUXSn being coupled to the inputs of the following secondary multiplexer MUXS(n+1); a first sequencing multiplexer MSEQ1 whose inputs are coupled to the main clock signal CLK and whose output is coupled to the first sequential element ES1 so as to sequence it by the first secondary clock signal SHS1; and N−1 following sequencing multiplexers MSEQ2 to MSEQN, the inputs of each sequencing multiplexer MSEQn (n>=2) being respectively coupled to the main clock signal CLK and to the outputs of the corresponding secondary multiplexer MUXSn−1 and, where relevant, of the preceding secondary multiplexer or multiplexers. Each sequencing multiplexer MSEQn is configured for delivering at the output a secondary clock signal SHSn to the sequential element corresponding ESn (n>=2) so as to sequence it.

It should be noted that the main multiplexers MUXP1 to MUXPN and the secondary multiplexers MUXS1 to MUXSN are controlled by the same set of control signals SC1 to SCN−1 delivered by the control circuit MC.

The sequencing multiplexers MSEQn are respectively controlled by a set of control signals SS1 to SSN delivered by the control circuit MC.

For this reason, for any given sequential element ESn, the device DIS illustrated in FIG. 5 is capable of carrying out a selective cancelling of the propagation times inherent to the main multiplexers MUXP1 to MUXP(n−1) disposed before the given sequential element ESn.

For this purpose, relative comparisons of the delays may be effected within the device DIS by delivering the test signal ST to the first sequential element ES1 and to the reference circuit MREF.

If the test signal ST contains the first Boolean value BOOL, a set of Boolean values is obtained at the outputs of the sequential elements starting with first Boolean values BOOL and potentially finishing with second Boolean values BOOL, as illustrated in FIG. 6. The set of Boolean values is generally known by those skilled in the art using the term "thermometer code".

Depending on the number of first Boolean values, the device DIS may be used to carry out comparisons relating to overall delays of the critical path replica RCC.

FIG. 6 illustrates three groups of results delivered by the device DIS according to the variant shown in FIG. 5. The configuration of the device DIS in group 1 is not as fast as that in group 2. The configuration of the device DIS in group 3 is the slowest from amongst the three groups 1 to 3.

Thus, the set of control signals SC1 to SCN−1 may, for example, be configured as a function of the results from the device DIS in such a manner as to adjust delays of the device DIS while at the same time selectively cancelling the propagation times of the programmable elements, here for example main multiplexers MUXPn.

What is claimed is:

1. A device for monitoring a critical path of an integrated circuit, comprising:
 a replica of the critical path comprising a chain of N sequential elements, with N being an integer greater than 2, at least two sequential elements mutually separated by a delay circuit programmable by at least one main multiplexer;
 wherein the delay circuit comprises N−1 delay stages, each delay stage being programmable by a corresponding main multiplexer, wherein two successive sequential elements are separated by a delay stage;
 a control circuit configured to control the at least one main multiplexer; and
 a sequencing module configured to sequence each sequential element starting from a main clock signal, wherein the sequencing module is configured to deliver, starting from the main clock signal, respectively to the N sequential elements, N secondary clock signals, wherein two successive secondary clock signals are mutually time shifted in such a manner as to take into account at least one propagation time inherent to the at least one main multiplexer of the corresponding delay stage.

2. The device according to claim 1, wherein the delay circuit comprises several main multiplexers and the sequencing module is configured for delivering, starting from the main clock signal, respectively to the sequential elements, secondary clock signals mutually time shifted in such a manner as to take into account the propagation times inherent to all the main multiplexers.

3. The device according to claim 2, wherein the sequencing module comprises as many secondary multiplexers as main multiplexers, the secondary multiplexers being organized into a chain of N−1 groups of secondary multiplexers connected in series, each group being associated with the main multiplexer(s) of the corresponding delay stage, each secondary multiplexer being matched with the corresponding main multiplexer, wherein inputs of the first secondary multiplexer of the first group receive the main clock signal, the first sequential element being designed to be sequenced by the main clock signal and the N−1 following sequential elements being designed to be sequenced by the N−1 secondary clock signals respectively delivered by the outputs of the last multiplexers of the N−1 groups, and wherein the control circuit is further configured for controlling the secondary multiplexers and the main multiplexers in an identical manner, each secondary multiplexer being matched with a corresponding main multiplexer.

4. The device according to claim 1, wherein the delay circuit comprises several main multiplexers and the sequencing module is configured for delivering, starting from the main clock signal, respectively to the sequential elements, secondary clock signals synchronized or mutually time shifted in such a manner as to selectively take into account the propagation times inherent to all the main multiplexers or to only at least one of the main multiplexers.

5. The device according to claim 4, wherein the sequencing module comprises as many secondary multiplexers as main multiplexers, the secondary multiplexers being organized into a chain of N secondary multiplexers connected in series, each secondary multiplexer being matched with the corresponding main multiplexer and at least two mutually matched sequencing multiplexers, the inputs of the first secondary multiplexer and of the first sequencing multiplexer being designed to receive the main clock signal, the output of the first sequencing multiplexer being designed to deliver the first secondary clock signal to the first sequential element, the inputs of the next sequencing multiplexer(s) being designed to receive at least the main clock signal and the output signal(s) from the secondary multiplexer(s) associated with the main multiplexer(s) of at least one delay stage, and the output of the next sequencing multiplexer(s) being designed to deliver to at least one following sequential element the following secondary clock signal(s), and wherein the control circuit is further configured for controlling the secondary multiplexers and the main multiplexers in an identical manner and for controlling the sequencing multiplexers by a selection signal.

6. The device according to claim 5, wherein the sequencing module comprises as many sequencing multiplexers as sequential elements, the inputs of the first sequencing multiplexer being designed to receive the main clock signal and the output of the first sequencing multiplexer being designed to deliver the first secondary clock signal to the first sequential element, the inputs of the following sequencing multiplexers being designed to receive the main clock signal and the output signal(s) from the corresponding secondary multiplexer and, where relevant, from the preceding secondary multiplexer(s), each sequencing multiplexer being configured for delivering to the corresponding sequential element the corresponding secondary clock signal.

7. The device according to claim 4, wherein each delay stage comprises a main multiplexer and several delay elements coupled to the input of the main multiplexer.

8. The device according to claim 7, wherein the delay elements are different.

9. The device according to claim 1, fabricated in an integrated manner in and on a substrate of the silicon-on-insulator type.

10. The device according to claim 9, wherein the substrate is of the fully-depleted silicon-on-insulator type.

11. A method for sequencing a device for monitoring a critical path of an integrated circuit, wherein said device comprises a replica of the critical path comprising a chain of N sequential elements, with N being an integer greater than 2, at least two sequential elements of the chain being mutually separated by a delay circuit programmable by at least one main multiplexer, the delay circuit comprises N−1 delay stages, each delay stage being programmable by a corresponding main multiplexer, wherein two successive sequential elements are separated by a delay stage of the delay circuit, the method comprising:
 delivering, respectively to the N sequential elements, starting from a main clock signal, of N secondary clock signals, two successive secondary clock signals being mutually time shifted in such a manner as to take into account at least one propagation time inherent to the at least one main multiplexer of the corresponding delay stage.

12. The method according to claim 11, wherein the delay circuit comprises several main multiplexers and the method comprises delivering, starting from the main clock signal, respectively to the sequential elements, of secondary clock signals mutually time shifted in such a manner as to take into account the propagation times inherent to all the main multiplexers.

13. The method according to claim 11, wherein the delay circuit comprises several main multiplexers and the method comprises delivering, starting from the main clock signal, respectively to the sequential elements, of secondary clock signals mutually time shifted in such a manner as to selectively take into account the propagation times inherent to all the multiplexers or to only at least one of the main multiplexers.

14. A device for monitoring a critical path of an integrated circuit, comprising:
a replica of the critical path comprising:
a first flip-flop clocked by a first clock signal;
a first multiplexer having plural inputs coupled to receive different delays of a signal from an output of the first flip-flop through a first delay circuit;
a second multiplexer having plural inputs coupled to receive different delays of a signal from an output of the first multiplexer through a second delay circuit;
a second flip-flop clocked by a second clock signal and having an input coupled to an output of the second multiplexer;
a control circuit configured to control a selection made by each of the first and second multiplexers; and
a sequencing circuit having an input receiving the first clock signal and an output generating the second clock signal shifted in time relative to the first clock signal in such a manner as to take into account propagation time inherent in at least said first and second multiplexers.

15. The device of claim 14, further comprising:
a third multiplexer having plural inputs coupled to receive different delays of a signal at the input of the second flip-flop through a third delay circuit; and
a third flip-flop clocked by a third clock signal and having an input coupled to an output of the third multiplexer;
wherein said control circuit is further configured to control a selection made by the third multiplexer; and
wherein the sequencing circuit has a further output generating the third clock signal shifted in time relative to the first clock signal in such a manner as to take into account propagation time inherent in at least said first, second and third multiplexers.

16. The device of claim 15, wherein the sequencing circuit comprises:
a first additional multiplexer having plural inputs coupled to receive the first clock signal;
a second additional multiplexer having plural inputs coupled to receive an output of the first additional multiplexer, wherein the second clock signal is derived from an output of the second additional multiplexer; and
a third additional multiplexer having plural inputs coupled to receive the second clock signal, wherein the third clock signal is derived from an output of the third additional multiplexer;
wherein said control circuit is further configured to control a selection made by each of the first, second and third additional multiplexers.

17. The device of claim 15, wherein the sequencing circuit comprises:
a first additional multiplexer having plural inputs coupled to receive the first clock signal;
a second additional multiplexer having plural inputs coupled to receive an output of the first additional multiplexer; and
a third additional multiplexer having a first input coupled to receive a first signal from an output of the first additional multiplexer and a second input coupled to receive a second signal from an output of the second additional multiplexer, wherein the second and third clock signals are output from the third additional multiplexer;
wherein said control circuit is further configured to control a selection made by each of the first, second and third additional multiplexers.

18. A device for monitoring a critical path of an integrated circuit, comprising:
a replica of the critical path comprising a first flip flop, a second flip flop and a delay circuit having an input coupled to an output of the first flip flop and an output coupled to an input of the second flip flop, wherein the delay circuit includes at least one main multiplexer and a signal propagation delay through the delay circuit is programmable by said at least one main multiplexer;
a control circuit configured to control selection by the at least one main multiplexer of the signal propagation delay; and
a sequencing module configured to sequence the first and second flip flops starting from a main clock signal, wherein the sequencing module is configured to deliver to the first and second flip flops, starting from the main clock signal, first and second secondary clock signals, respectively, that are mutually time shifted in such a manner as to take into account at least one propagation time inherent to the at least one main multiplexer.

19. The device according to claim 18, wherein said at least one main multiplexer comprises a plurality of main multiplexers, and wherein the delay circuit comprises a plurality of delay stages, each delay stage being programmable by a corresponding one of the main multiplexers.

20. The device according to claim 19, wherein the sequencing module is further configured to sequence the first and second flip flops with the first and second secondary clock signals mutually time shifted in such a manner as to take into account the propagation times inherent to said plurality of main multiplexers.

21. The device according to claim 20, wherein the sequencing module comprises a plurality of secondary multiplexers coupled in series with an output of one secondary multiplexer coupled to plural inputs of another secondary multiplexer, and wherein the first secondary clock signal is generated at an input of a first secondary multiplexer of said plurality of secondary multiplexers and the second secondary clock signal is generated at an output of a last secondary multiplexer of said plurality of secondary multiplexers.

22. The device according to claim 21, wherein all inputs of the first secondary multiplexer receive the main clock signal.

23. The device according to claim 21, wherein each main multiplexer has a corresponding secondary multiplexer, and wherein the corresponding main and secondary multiplexers are controlled to make selections by a same control signal generated by the control circuit.

24. The device according to claim 20, wherein the sequencing module comprises a plurality of secondary multiplexers, wherein a first secondary multiplexer of said plurality of secondary multiplexers has an input receiving the main clock signal and an output generating the first secondary clock signal, and wherein remaining ones of the secondary multiplexers are coupled in series with an output of one secondary multiplexer coupled to plural inputs of another secondary multiplexer, and wherein the second secondary clock signal is generated from an output of a last secondary multiplexer of said plurality of secondary multiplexers.

25. The device according to claim 24, wherein the sequencing module comprises an output multiplexer having inputs connected to outputs of each secondary multiplexer of said remaining ones of the secondary multiplexers and having an output generating said second secondary clock signal.

26. The device according to claim 24, wherein each main multiplexer has a corresponding secondary multiplexer from said remaining ones of the secondary multiplexers, and wherein the corresponding main and secondary multiplexers are controlled to make selections by a same control signal generated by the control circuit.

27. The device according to claim 20, wherein the sequencing module comprises:
- a first secondary multiplexer having an input receiving the main clock signal and an output generating the first secondary clock signal;
- a second secondary multiplexer having an input receiving the main clock signal; and
- a sequencing multiplexer having inputs receiving the main clock signal and an output of the second secondary multiplexer and having an output generating the second secondary clock signal.

28. The device according to claim 19, wherein each delay stage comprises a main multiplexer and several delay elements coupled to the input of the main multiplexer.

29. The device according to claim 28, wherein the delay elements are different.

30. The device according to claim 18, fabricated in an integrated manner in and on a substrate of the silicon-on-insulator type.

31. The device according to claim 30, wherein the substrate is of the fully-depleted silicon-on-insulator type.

32. A method for sequencing a device for monitoring a critical path of an integrated circuit, wherein said device comprises a replica of the critical path comprising a first flip flop and a second flip flop, said first and second flip flops separated by a delay circuit providing a signal delay that is programmable by at least one main multiplexer, the method comprising: delivering to the first and second flip flops, starting from a main clock signal, first and second secondary clock signals, respectively, wherein the first and second secondary clock signals are mutually time shifted in such a manner as to take into account at least one propagation time inherent to the at least one main multiplexer.

33. The method according to claim 32, wherein the delay circuit comprises a plurality of delay stages, each delay stage being programmable by at least one main multiplexer, wherein the first and second secondary clock signals are mutually time shifted in such a manner as to take into account at least one propagation time inherent to the at least one main multiplexer of the corresponding delay stage.

34. The method according to claim 32, wherein the delay circuit comprises several main multiplexers and the method comprises delivering, starting from the main clock signal, respectively to the sequential elements, the first and second secondary clock signals mutually time shifted in such a manner as to take into account the propagation times inherent to all the main multiplexers.

35. The method according to claim 32, wherein the delay circuit comprises several main multiplexers and the method comprises delivering, starting from the main clock signal, respectively to the sequential elements, the first and second secondary clock signals mutually time shifted in such a manner as to selectively take into account the propagation times inherent to only at least one of the main multiplexers.

* * * * *